United States Patent

Kanamori

(10) Patent No.: US 10,359,165 B2
(45) Date of Patent: Jul. 23, 2019

(54) BOARD AND VEHICLE LAMP

(71) Applicant: Koito Manufacturing Co., Ltd., Tokyo (JP)

(72) Inventor: Akitaka Kanamori, Shizuoka (JP)

(73) Assignee: Koito Manufacturing Co., Ltd., Tokyo (JP)

( * ) Notice: Subject to any disclaimer, the term of this patent is extended or adjusted under 35 U.S.C. 154(b) by 0 days.

(21) Appl. No.: 16/044,865

(22) Filed: Jul. 25, 2018

(65) Prior Publication Data

US 2019/0041019 A1 Feb. 7, 2019

(30) Foreign Application Priority Data

Aug. 7, 2017 (JP) ................................. 2017-152765

(51) Int. Cl.
*H05K 1/02* (2006.01)
*F21V 19/00* (2006.01)
*H01L 33/48* (2010.01)
*H01L 33/62* (2010.01)
*F21S 41/141* (2018.01)

(52) U.S. Cl.
CPC ........ *F21S 41/141* (2018.01); *F21V 19/0065* (2013.01); *H01L 33/486* (2013.01); *H01L 33/62* (2013.01); *H05K 1/028* (2013.01)

(58) Field of Classification Search
CPC ........ F21S 41/141; F21S 43/14; H05K 1/028; H05K 1/0274; H05K 1/0306; H05K 2201/0108; H05K 2201/10106; H05K 2201/0326; F21V 19/0065; H01L 33/486; H01L 33/62; Y10S 428/901
See application file for complete search history.

(56) References Cited

U.S. PATENT DOCUMENTS

| 6,270,236 B1 * | 8/2001 | Brussog | H05K 1/0274 362/235 |
| 10,204,887 B2 * | 2/2019 | Rong | H01L 25/0753 |
| 10,205,077 B2 * | 2/2019 | Chae | H01L 33/62 |
| 2015/0176783 A1 * | 6/2015 | Hata | H05K 1/0278 362/223 |
| 2019/0041024 A1 * | 2/2019 | Yamaguchi | F21S 41/32 |
| 2019/0051999 A1 * | 2/2019 | Coakley | H05K 1/028 |

FOREIGN PATENT DOCUMENTS

| JP | 2013-175335 A | 9/2013 | |
| JP | 2018206996 | * 12/2018 | F21S 4/00 |

* cited by examiner

*Primary Examiner* — Joseph L Williams
*Assistant Examiner* — Jose M Diaz
(74) *Attorney, Agent, or Firm* — Abelman, Frayne & Schwab

(57) ABSTRACT

An FPC includes a base film and a land provided in a conductive pattern formed on a surface of the base film. The land includes a window portion which enables the state of a solder to be checked from the back side of the base film 31 when the FPC is bonded to the circuit board by solder.

4 Claims, 11 Drawing Sheets

HEATING

HEATING

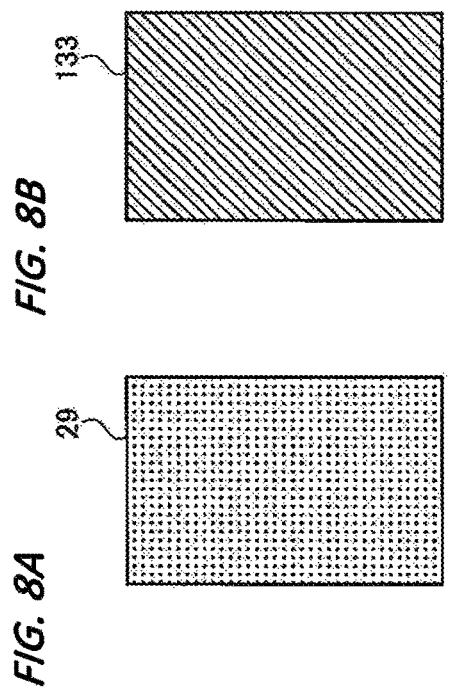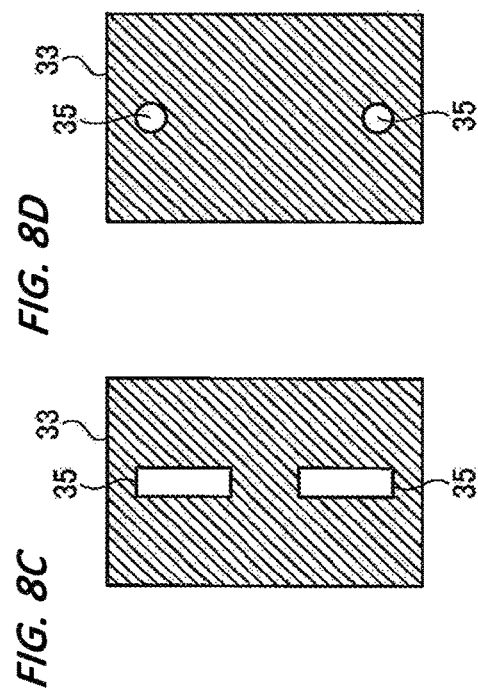

BOARD AND VEHICLE LAMP

CROSS-REFERENCE TO RELATED APPLICATIONS

This application is based on and claims priority from Japanese Patent Application No. 2017-152765, filed on Aug. 7, 2017 with the Japan Patent Office, the disclosure of which is incorporated herein in its entirety by reference.

TECHNICAL FIELD

The present disclosure relates to a board and a vehicle lamp using the board.

BACKGROUND

In the related art, a vehicle lamp using a flexible printed circuit board (FPC) in order to wire to a light emitting element such as LED is known (e.g., see Japanese Laid-open Patent Publication No. 2013-175335).

SUMMARY

A conductive pattern is formed on an FPC, and a land is provided on the conductive pattern. A bonding object such as an LED is mounted on an FPC by being soldered to a land. At this time, it is desirable that it is possible to check the state of soldering. However, since the land is usually made of an opaque material, there is a problem in that it is impossible to check the state of soldering through the land.

The present disclosure has been made in consideration of the situation, and provides a technology that is able to easily check a bonding state between a printed circuit board and a bonding object.

In order to solve the above problem, a board of an aspect of the present disclosure includes a substrate and a land provided on a conductive pattern formed on a surface of the substrate. The land includes a window portion which enables the state of a conductive member to be checked from the back side of the substrate when the board is bonded to the bonding object by the conductive member.

The window portion may be a portion where a part of a conductive foil is removed from the land.

The substrate may be translucent, and the window portion may be a portion where the substrate is left by removing a part of the conductive foil from the land.

Another aspect of the present disclosure is a vehicle lamp. The vehicle lamp includes a circuit board on which a light emitting element is mounted and a board bonded to the circuit board. The board includes a substrate and a land provided on a conductive pattern formed on a surface of the substrate. The land includes a window portion which enables the state of a conductive member to be checked from the back side of the substrate when the board is bonded to the circuit board by the conductive member.

According to the present disclosure, it is possible to easily check the bonding state between the board and the bonding object.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

FIGS. 8A to 8F are views for explaining patterns of lands.

DETAILED DESCRIPTION

In the following detailed description, reference is made to the accompanying drawing, which form a part hereof. The illustrative embodiments described in the detailed description, drawing, and claims are not meant to be limiting. Other embodiments may be utilized, and other changes may be made, without departing from the spirit or scope of the subject matter presented here.

Hereinafter, a vehicle lamp according to an embodiment of the present disclosure will be described in detail with reference to the accompanying drawings. In the present specification, the terms representing directions such as, for example, "upper," "lower," "front," "rear," "left," "right," "inner," and "outer" as used here mean directions in a posture when the vehicle lamp is mounted on the vehicle.

Figure 1:
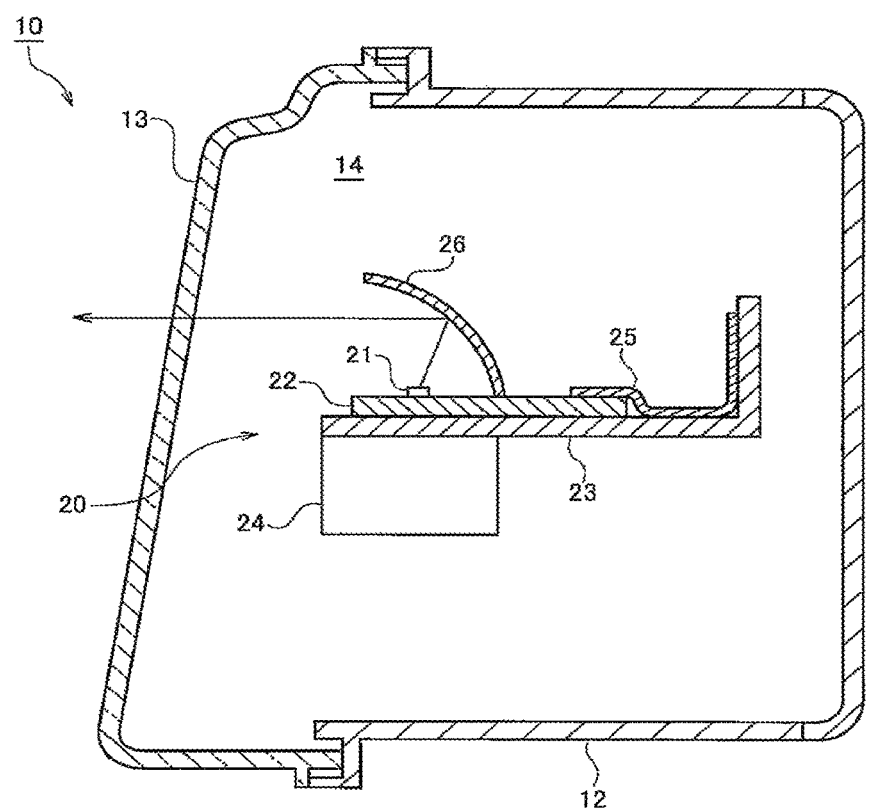
FIG. 1 is a schematic cross-sectional view of a vehicle lamp using an FPC according to an exemplary embodiment of the present disclosure.

FIG. 1 is a schematic cross-sectional view of a vehicle lamp 10 using an FPC 25 according to an exemplary embodiment of the present disclosure.

As illustrated in FIG. 1, the vehicle lamp 10 includes a lamp body 12 and a transparent outer cover 13 that covers a front surface opening of the lamp body 12. The lamp body 12 and the outer cover 13 form a lamp compartment 14. A lamp unit 20 is accommodated in the lamp chamber 14. The lamp unit 20 is fixed to the lamp body 12.

The lamp unit 20 includes an LED 21, a circuit board 22 on which the LED 21 is mounted, a support member 23 configured to support the circuit board 22, a heat sink 24 configured to dissipate heat generated from the LED, an FPC 25 electrically connected to the circuit board 22, and a reflector 26 configured to reflect the light emitted from the LED 21 toward the front of the lamp. The FPC 25 supplies electric power to the LED 21 via the circuit board 22.

Figure 2:
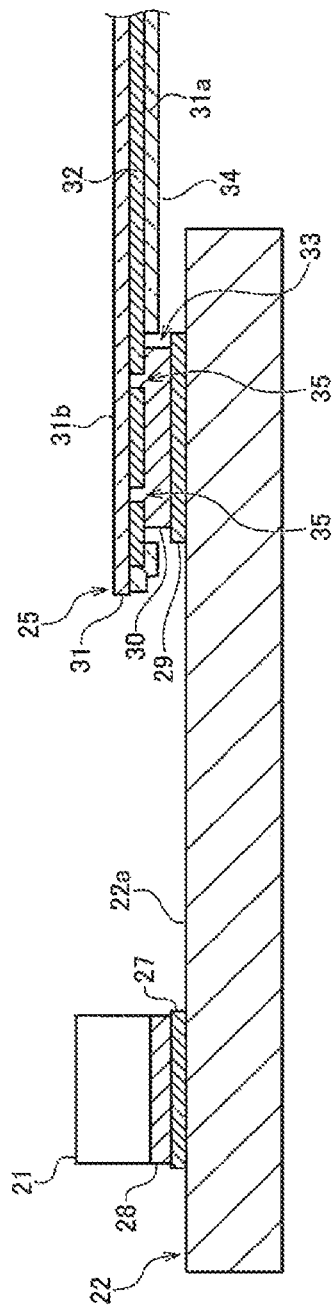
FIG. 2 is a view for explaining a bonding state between a circuit board and an FPC.
Figure 3:
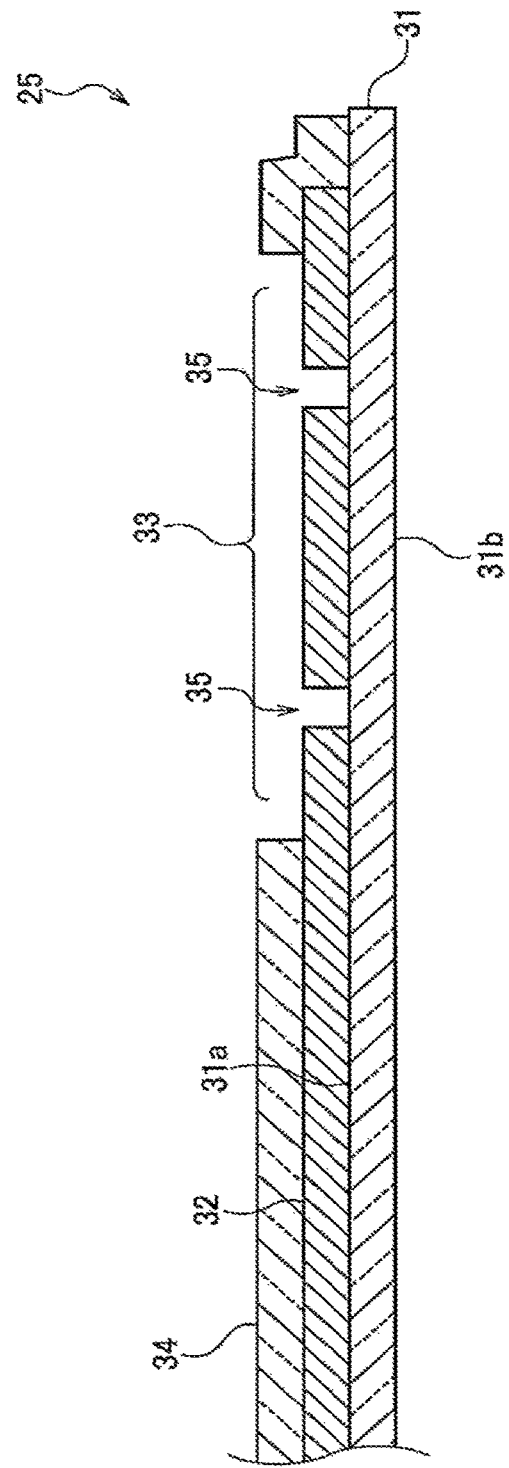
FIG. 3 is a view for explaining a configuration of an FPC according to an exemplary embodiment of the present disclosure.

FIG. 2 is a view for explaining a bonding state between the circuit board 22 and the FPC 25. In FIG. 2, the illustration of the reflector 26 is omitted for simplicity. FIG. 3 is a view for explaining a configuration of the FPC 25 according to an exemplary embodiment of the present disclosure.

The circuit board 22 may be a rigid board. As illustrated in FIG. 2, on a surface 22a of the circuit board 22, a board-side first land 27 for mounting the LED 21 is provided. On the board-side first land 27, the LED 21 is mounted by solder 28.

Further, on the surface 22a of the circuit board 22, a board-side second land 29 for bonding the FPC 25 is formed. On the board-side second land 29, the FPC 25 is mounted by solder 30.

The FPC 25 includes a flexible base film 31 as a substrate, a conductive pattern 32 formed on a surface 31a of the base film 31, and a cover film 34 provided on the conductive pattern 32. The conductive pattern 32 is made of, for example, a conductive foil such as a copper foil. The base film 31 is formed of a translucent member.

The conductive pattern 32 is provided with an FPC-side land 33 bonded to the board-side second land 29 of the circuit board 22 by solder 30. As illustrated in FIGS. 2 and 3, the cover film 34 is not formed on a part of the FPC-side land 33, thus the FPC-side land 33 is exposed.

In the FPC 25 according to the exemplary embodiment, the FPC-side land 33 includes a portion 35 where a part of the conductive foil is removed. In other words, when viewed from the cover film 34 side, the FPC-side land 33 includes a slit formed in a part of the outer shape of the conductive foil or an opening formed inside the conductive foil. In the present specification, a portion where a part of the conductive foil is removed (that is, a slit or an opening formed in the conductive foil) is referred to as a "window portion." The translucent base film 31 is left in the window portion 35. Two window portions 35 are formed in FIGS. 2 and 3, but the number of the window portion 35 is not particularly limited.

In the exemplary embodiment, by providing the window portion 35, when the FPC-side land 33 of the FPC 25 is bonded to the board-side second land 29 of the circuit board 22 by solder 30, it is possible to check the state of the solder 30 from the back side 31b of the base film 31. For example, when the solder 30 is visually recognizable from the window portion 35 when viewed from the back side 31b of the base film 31, it may be checked that the solder 30 is wet-spread on the board-side second land 29, therefore it is able to determine that the FPC-side land 33 and the board-side second land 29 are properly bonded to each other.

Figure 4A:
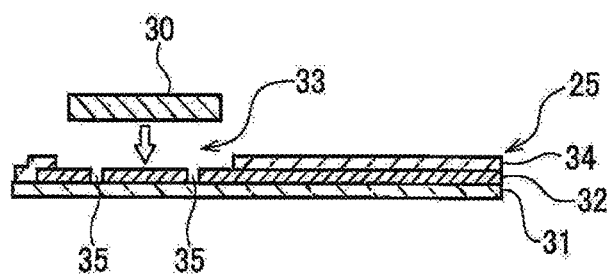
FIGS. 4A to 4C are views for explaining a bonding method of a circuit board and an FPC.
Figure 4B:
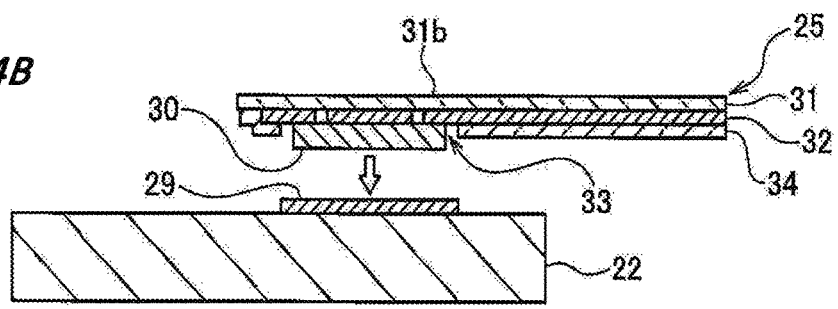
Figure 4C:
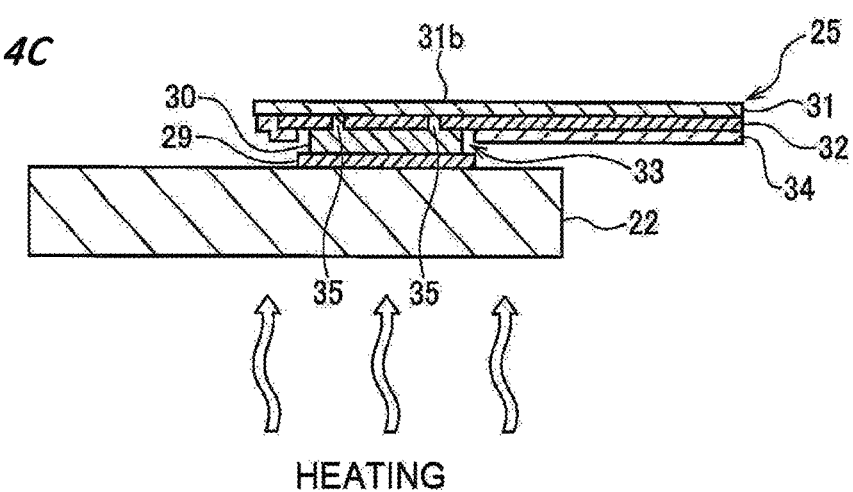

FIGS. 4A to 4C are views for explaining a bonding method of the circuit board 22 and the FPC 25.

First, as illustrated in FIG. 4A, solder 30 is printed on the FPC-side land 33 of the FPC 25. Next, as illustrated in FIG. 4B, the board-side second land 29 of the circuit board 22 and the FPC-side land 33 of the FPC 25 are made to face each other, and the solder 30 printed on the board-side second land 29 is brought into contact with the board-side second land 29. At this time, it is desirable to make the FPC 25 parallel to the circuit board 22 using, for example, a jig. Next, as illustrated in FIG. 4C, the solder 30 is heated and melted using, for example, a heater, and then the board-side second land 29 and the FPC-side land 33 are reflow soldered.

When the solder 30 is heated so that the state of the solder turns from the solid state to the liquid state, the solder 30 gathers due to the surface tension. Therefore, the solder 30 is separated with the window portion 35 of the FPC-side land 33 as a boundary.

When the solder 30 in the liquid state comes into contact with the second land 29 of the circuit board 22 of the bonding object, the solder 30 tends to be wet-spread out to the second land 29 so as to make the surface energy more stable. When the solder 30 is visually recognizable from the window portion 35 when observed from the back side 31b of the base film 31 of the FPC 25, it means that the solder 30 is suitably wet-spread on the board-side second land 29. Therefore, it is able to indirectly check that the FPC-side land 33 and the board-side second land 29 are properly bonded to each other.

On the contrary, when the solder 30 in the liquid state does not come into contact with the second land 29 of the circuit board 22 of the bonding object, the solder 30 tends to maintain the separated state with the window portion 35 as a boundary. Therefore, the solder 30 is not wet-spread on the second land 29. When the solder 30 is not visually recognizable from the window portion 35 when observed from the back side 31b of the base film 31 of the FPC 25, it means that the solder 30 is not suitably wet-spread on the board-side second land 29. Therefore, it is able to indirectly check that the FPC-side land 33 and the board-side second land 29 are not properly bonded to each other.

Figure 5:
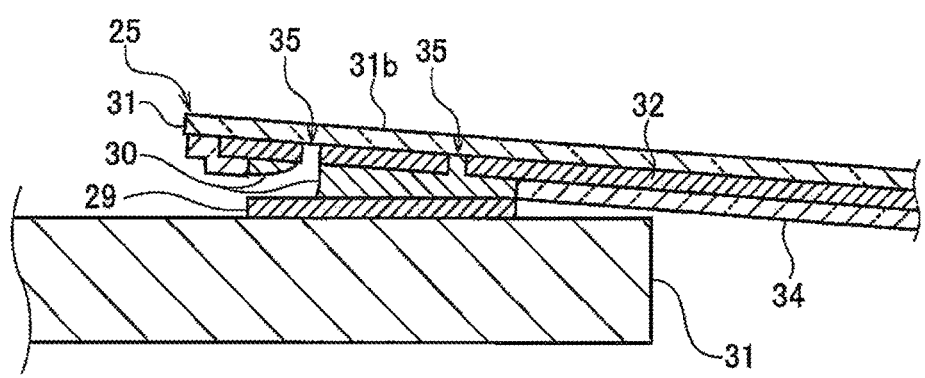
FIG. 5 is a view for explaining an example of a state where an FPC-side land and a board-side second land are not properly bonded according to the method described in FIGS. 4A to 4C.

FIG. 5 is a view for explaining an example of a state where an FPC-side land 33 and a board-side second land 29 are not properly bonded according to the method described in FIGS. 4A to 4C. For example, when reflow soldering is performed with the FPC 25 inclined relative to the circuit board 22, even if a part of the solder 30 is in a liquid state, the solder does not come into contact with the second land 29. As a result, there is a possibility that the solder is not sufficiently wet-spread on the board-side second land 29. When the solder 30 is not sufficiently spread on the board-side second land 29, the solder 30 tends to harden while avoiding the window portion 35 from which the copper foil is removed. In a bonding example illustrated in FIG. 5, the solder 30 is visually recognizable from one window portion 35 of the two window portions 35. However, the solder 30 is not able to be visually recognized from the other window portion 35, but the board-side second land 29 is visually recognized. In this manner, by observing the state of the solder 30 from the window portions 35, it is possible to check that the solder 30 is not spread over the entire board-side second land 29 and that the reflow soldering is abnormal. The check of state of the solder 30 from the window portions 35 may be performed directly by the operator with his/her eyes or based on an image taken by a camera. The state of the solder 30 may be checked by contrast of the image due to the difference in reflectance.

Figure 6A:
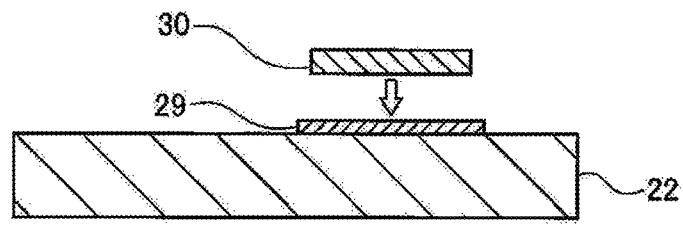
FIGS. 6A to 6C are views for explaining another bonding method of a circuit board and an FPC.
Figure 6B:
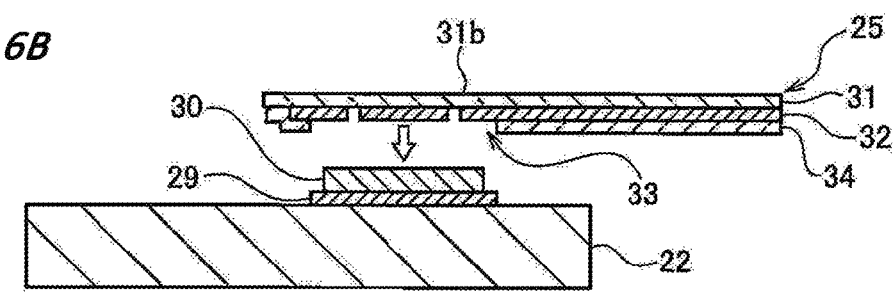
Figure 6C:
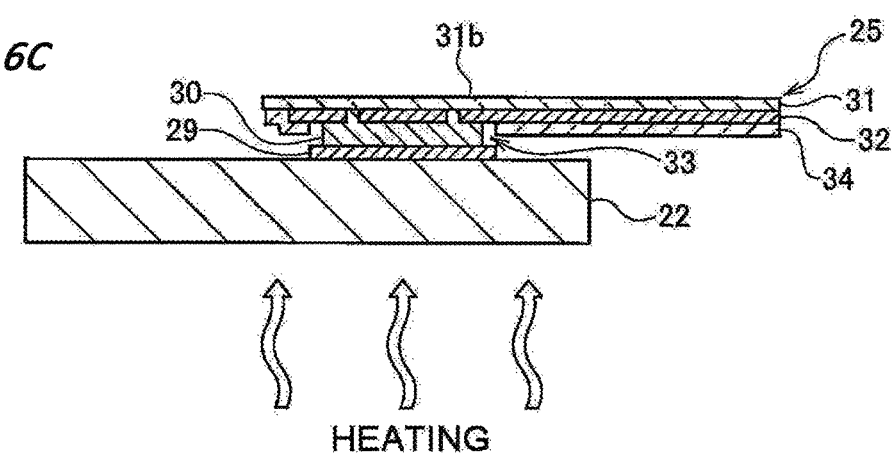

FIGS. 6A to 6C are views for explaining another bonding method of a circuit board 22 and an FPC 25.

In the method, first, as illustrated in FIG. 6A, solder 30 is printed on the board-side second land 29 of the circuit board 22. Next, as illustrated in FIG. 6B, the board-side second land 29 of the circuit board 22 and the FPC-side land 33 of the FPC 25 are made to face each other, and the solder 30 printed on the board-side second land 29 is brought into contact with the FPC-side land 29. At this time, it is desirable to make the FPC 25 parallel to the circuit board 22 using, for example, a jig. Next, as illustrated in FIG. 4C, the solder 30 is heated and melted using, for example, a heater, and then the board-side second land 29 and the FPC-side land 33 are reflow soldered. In the same way as above, by observing the window portions 35 from the back side 31b of the base film 31 of the FPC 25, it is possible to check whether the solder 30 is wet-spread on the board-side second land 29.

Figure 7:
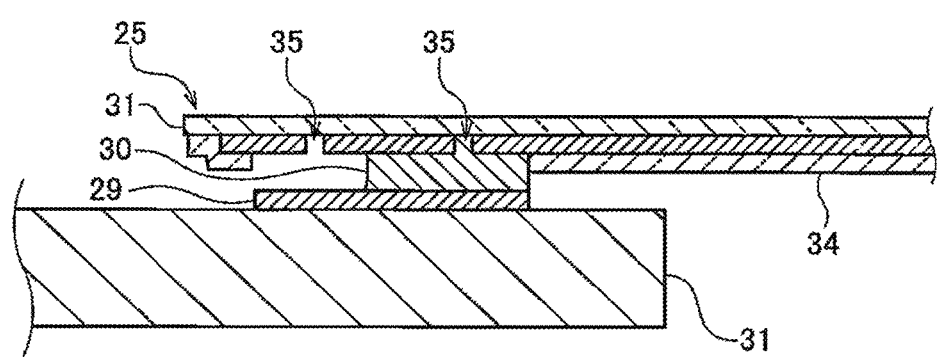
FIG. 7 is a view for explaining an example of a state where an FPC-side land and a board-side second land are not properly bonded according to the method described in FIGS. 6A to 6C.

FIG. 7 is a view for explaining an example of a state where an FPC-side land 33 and a board-side second land 29 are not properly bonded according to the method described in FIGS. 6A to 6C. For example, when the solder 30 is not printed in an appropriate amount on the board-side second land 29 (for example, when the solder 30 is printed only in a region about half of the board-side second land 29), there is a possibility that the solder 30 is not sufficiently wet-spread on the board-side second land 29. In a bonding example illustrated in FIG. 7, the solder 30 is visually recognizable from one window portion 35 of the two window portions 35. However, the solder 30 is not visually recognizable from the other window portion 35, but the board-side second land 29 is visually recognizable. In this manner, by observing the state of the solder 30 from the window portions 35, it is possible to check that the solder 30 is not spread over the entire board-side second land 29 and that the reflow soldering is abnormal.

As described above, according to the FPC 25 according to the exemplary embodiment, it is possible to easily check the bonding state with the circuit board 22 which is a bonding object.

As described above, in the FPC 25 according to the exemplary embodiment, the window portion 35 is a portion where a part of the conductive foil is removed from the FPC-side land 33 and the translucent base film 31 is left. In the same way, by leaving the base film 31 in the window portion 35, it is possible to prevent the flux contained in the solder 30 from evaporating during reflowing and coming out to the back side of the FPC 25 through the window portion 35.

When the flux is scattered during reflowing, the flux may adhere to the jig used for bonding the FPC 25 to the circuit board 22. When the flux adheres to the jig, since the FPC 25 is inclined with respect to the jig by the thickness of the flux when another FPC 25 is set on the jig, which hinders the bonding. In the FPC 25 according to the exemplary embodiment, since the scattering of the flux is able to be suppressed by leaving the base film 31 in the window portion 35, it is possible to prevent such a situation from occurring.

In other embodiments, the window portion 35 may be formed as a through hole without leaving the base film 31. In this case, it is not necessary to form the base film 31 with a translucent member.

FIGS. 8A to 8F are views for explaining patterns of lands. FIG. 8A illustrates a pattern of the board-side second land 29 in a rectangular shape. FIG. 8B illustrates a pattern of the FPC-side land 80 where a window portion is not provided in a normal rectangular shape as a comparative example.

FIGS. 8C to 8F illustrate patterns of the FPC-side land 33 in the FPC 25 according to the exemplary embodiment.

The FPC-side land 33 illustrated in FIG. 8C includes two rectangular window portions 35. The first window portion 35 is provided in the upper side in the longitudinal direction of the FPC-side land 33 and in the center in the short direction. The second window portion 35 is provided in the lower side in the longitudinal direction of the FPC-side land 33 and in the center in the short direction.

The FPC-side land 33 illustrated in FIG. 8D includes two circular window portions 35. The first window portion 35 is provided in the upper side in the longitudinal direction of the FPC-side land 33 and in the center in the short direction. The second window portion 35 is provided in the lower side in the longitudinal direction of the FPC-side land 33 and in the center in the short direction.

The FPC-side land 33 illustrated in FIG. 8E includes two slit shape window portions 35. The first window portion 35 is provided in the upper side in the longitudinal direction of the FPC-side land 33 and in the center in the short direction. The second window portion 35 is provided in the lower side in the longitudinal direction of the FPC-side land 33 and in the center in the short direction.

The FPC-side land 33 illustrated in FIG. 8F includes four rectangular window portions 35. The first window portion 35 is provided in the upper side in the longitudinal direction of the FPC-side land 33 and in the left side in the short direction, and the second window portion 35 is provided in the upper side in the longitudinal direction of the FPC-side land 33 and in the right side in the short direction. The third window portion is provided in the lower side in the longitudinal direction of the FPC-side land 33 and in the left side in the short direction and the fourth window portion is provided in the lower side in the longitudinal direction of the FPC-side land 33 and in the right side in the short direction.

Although the shape and the number of the window portions 35 are not limited, at least two window portions 35 may be provided in order to properly check wet spreading of solder. When the board-side second land 29 which is a bonding object is a rectangular shape as illustrated in FIG. 8A, at least one window portion 35 may be provided in the upper side in the longitudinal direction and in the lower side in the longitudinal direction.

In the FPC 25 according to the exemplary embodiment, the window portion 35 is formed by removing a part of the conductive foil of the FPC-side land 33, but this intends to remove a part of the conductive foil of a series of lands set to the same electric potential. Note that, for example, an area without conductive foil between two different lands set to different potentials is not included in the window portion 35.

Hereinafter, another pattern of the FPC-side land 33 in the FPC 25 according to the exemplary embodiment will be described.

Figure 9:
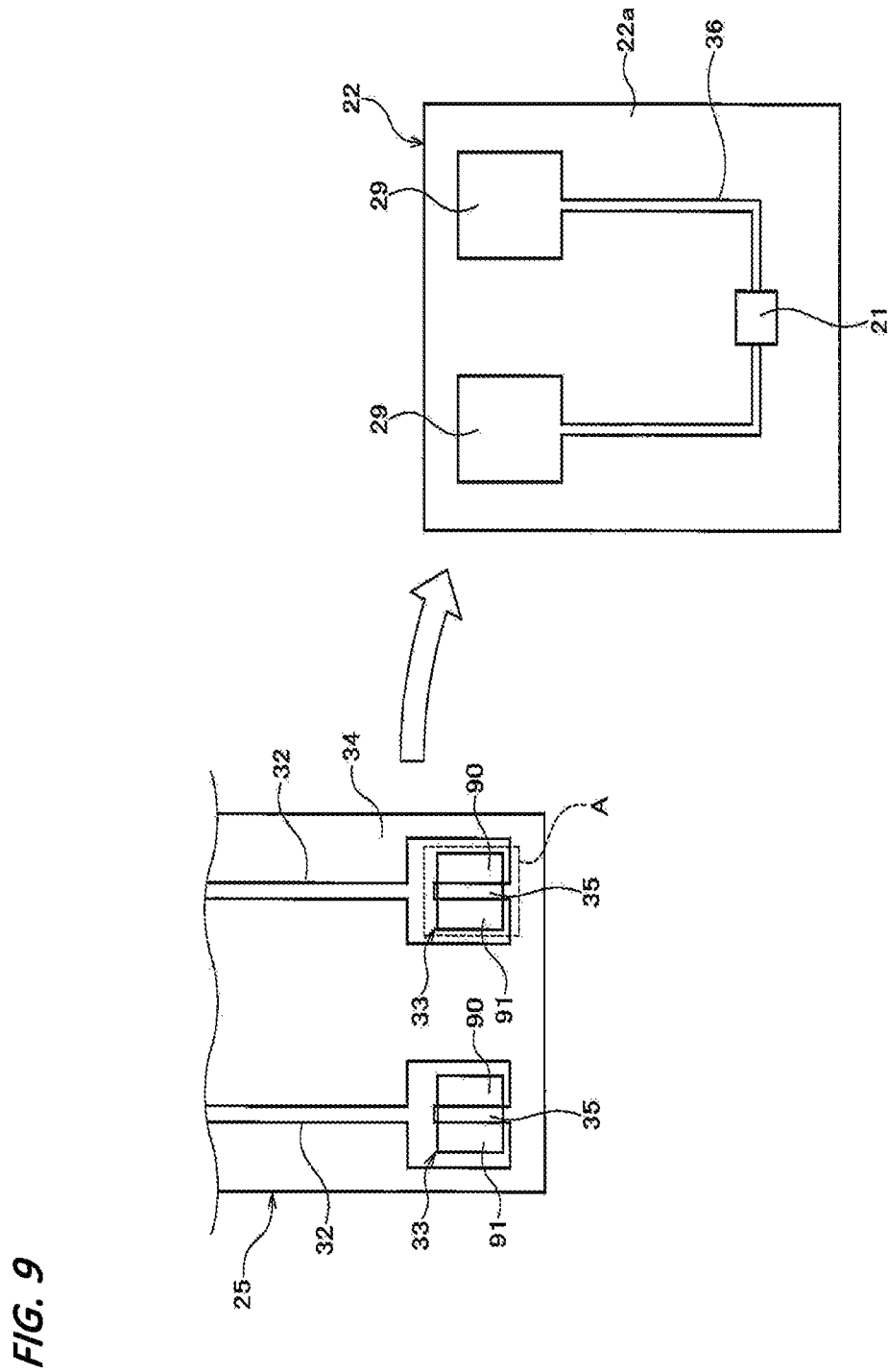
FIG. 9 is a schematic plan view of a circuit board and an FPC before bonding.

FIG. 9 is a schematic plan view of a circuit board 22 and an FPC 25 before bonding. As illustrated in FIG. 9, board-side second lands 29 are formed on a surface 22*a* of the circuit board 22. The board-side second lands 29 are wired to a LED 21 via conductive patterns 36. Further, conductive patterns 32 are formed on the FPC 25, and an FPC-side land 33 is formed at each end of the conductive patterns 32. The FPC-side land 33 of the FPC 25 is bonded to the board-side second land 29 of the circuit board 22 via solder.

Figure 10:
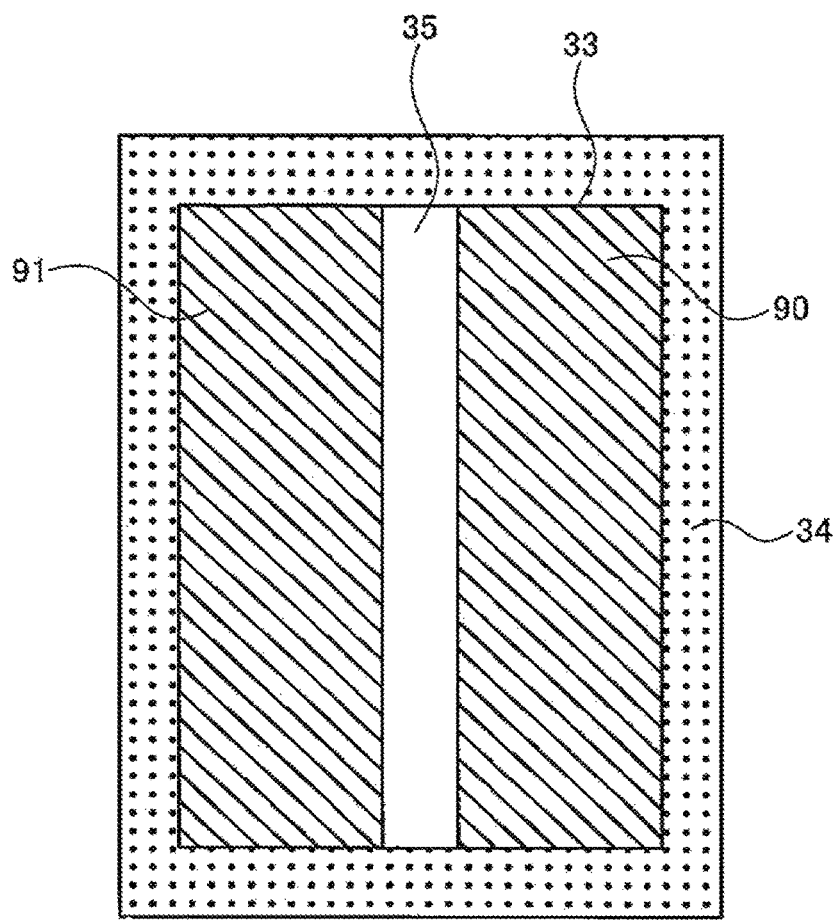
FIG. 10 is a view illustrating a modified example of an FPC-side land in an FPC according to an exemplary embodiment of the present disclosure.

FIG. 10 is an enlarged view of a portion A surrounded by a broken line in the FPC 25 illustrated in FIG. 9, and illustrates a modified example of the FPC-side land 33. The FPC-side land 33 illustrated in FIG. 10 seems to be divided into two lands 90 and 91, but in reality, the two lands 90 and 91 are connected at a portion covered with the cover film 34 (e.g., see FIG. 9). Therefore, since the two lands 90 and 91 are a series of lands set to the same potential, the region without the conductive foil between the two lands 90 and 91 functions as the window portion 35.

Figure 11:
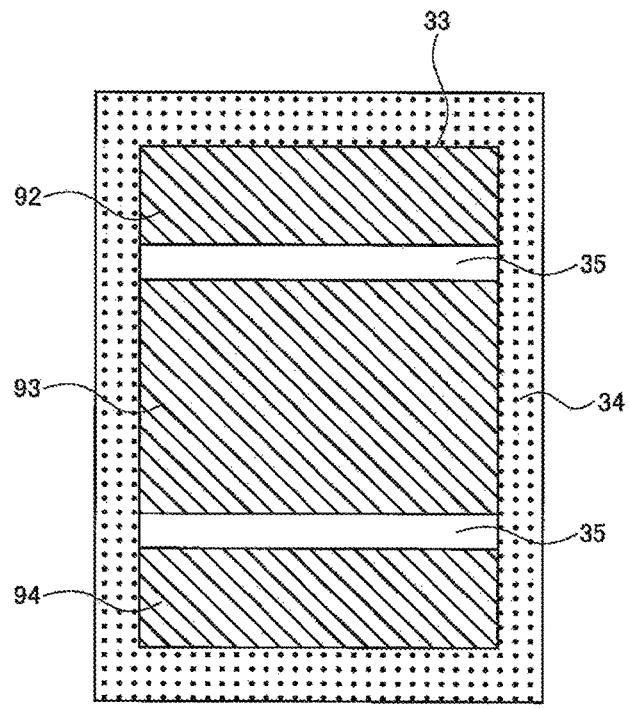
FIG. 11 is a view illustrating another modified example of an FPC-side land in an FPC according to an exemplary embodiment of the present disclosure.

FIG. 11 illustrates another modified example of the FPC-side land 33. The FPC-side land 33 illustrated in FIG. 11 seems to be divided into three lands 92, 93, and 94, but in reality, the three lands 92, 93, and 94 are connected at a portion covered with the cover film 34. Therefore, since the three lands 92, 93, and 94 are a series of lands set to the same potential, the region without the conductive foil between the three lands 92, 93, and 94 functions as the window portion 35.

Figure 12:
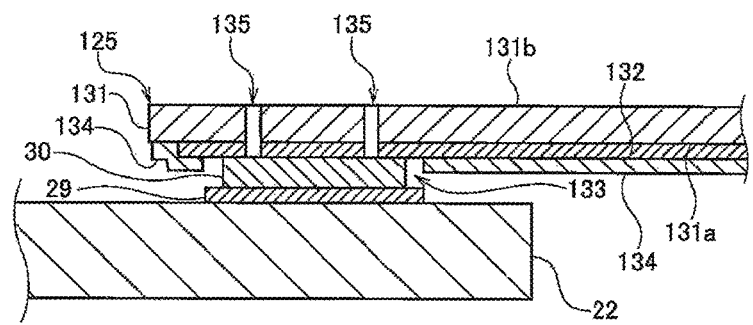
FIG. 12 is a view for explaining a board according to another exemplary embodiment of the present disclosure.

FIG. 12 is a view for explaining a board 125 according to another exemplary embodiment of the present disclosure. In the above, the board 125 according to the exemplary embodiment is different from the FPC 25 according to the above described embodiment in that the board 125 is a rigid board.

The board 125 includes a substrate 131, a conductive pattern 132 formed on a surface 131a of the substrate 131, and a resist 134 provided on the conductive pattern 132. The conductive pattern 32 is made of, for example, a conductive foil such as a copper foil.

The conductive pattern 132 is provided with a board-side land 133 bonded to the board-side second land 29 of the circuit board 22 by solder 30. As illustrated in FIGS. 2 and 3, the resist 134 is not formed on a part of the board-side land 133, thus the board-side land 133 is exposed.

In the board 125 according to the exemplary embodiment, the board-side land 133 includes a portion (that is, a through hole) 135 where a part of the conductive foil and the substrate 131 is removed. In the present specification, the through hole is referred to as a "window portion." Two window portions 135 are formed in FIG. 12, but the number of the window portion 135 is not particularly limited.

In the exemplary embodiment, by providing the window portion 135, when the board-side land 133 of the board 125 is bonded to the board-side second land 29 of the circuit board 22 by solder 30, the state of the solder 30 is able to be checked from the back side 131b of the substrate 131. For example, when the solder 30 is able to be visually recognized from the window portion 135 when viewed from the back side 131b of the substrate 131, it may be checked that the solder 30 is wet-spread on the board-side second land 29, therefore it is able to determine that the board-side land 133 and the board-side second land 29 are properly bonded to each other. For example, when the solder 30 is not able to be visually recognized from the window portion 135, it may be checked that the solder 30 is not wet-spread on the board-side second land 29, therefore it is able to determine that the board-side land 133 and the board-side second land 29 are not properly bonded to each other.

As described above, according to the board 125 according to the exemplary embodiment, it is possible to easily check the bonding state with the circuit board 22 which is a bonding object.

From the foregoing, it will be appreciated that various exemplary embodiments of the present disclosure have been described herein for purposes of illustration, and that various modifications may be made without departing from the scope and spirit of the present disclosure. Accordingly, the various exemplary embodiments disclosed herein are not intended to be limiting, with the true scope and spirit being indicated by the following claims.

What is claimed is:

1. A board comprising:
   a substrate; and
   a land provided on a conductive pattern formed on a surface of the substrate,
   wherein the land includes a window portion which enables a state of a conductive member to be checked from a back side of the substrate when the board is bonded to a bonding object by the conductive member.

2. The board of claim 1, wherein the window portion is a portion where a part of a conductive foil is removed from the land.

3. The board of claim 1, wherein the substrate is translucent, and the window portion is a portion where the substrate is left by removing a part of the conductive foil from the land.

4. A vehicle lamp comprising:
   a circuit board on which a light emitting element is mounted; and
   a board bonded to the circuit board,
   wherein the board includes a substrate and a land provided on a conductive pattern formed on a surface of the substrate, and the land includes a window portion which enables a state of a conductive member to be checked from a back side of the substrate when the board is bonded to the circuit board by the conductive member.

* * * * *